United States Patent
Lang et al.

(10) Patent No.: US 9,130,196 B2
(45) Date of Patent: Sep. 8, 2015

(54) LIGHT-EMITTING COMPONENT AND METHOD FOR PRODUCING A LIGHT-EMITTING COMPONENT

(75) Inventors: Erwin Lang, Regensburg (DE); Daniel Steffen Setz, Boeblingen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/348,906

(22) PCT Filed: Aug. 20, 2012

(86) PCT No.: PCT/EP2012/066203
§ 371 (c)(1),
(2), (4) Date: Apr. 1, 2014

(87) PCT Pub. No.: WO2013/053517
PCT Pub. Date: Apr. 18, 2013

(65) Prior Publication Data
US 2014/0264311 A1    Sep. 18, 2014

(30) Foreign Application Priority Data

Oct. 13, 2011   (DE) .......................... 10 2011 084 437

(51) Int. Cl.
*H01L 51/52* (2006.01)
*H01L 51/56* (2006.01)
*H01L 51/00* (2006.01)

(52) U.S. Cl.
CPC .......... *H01L 51/5275* (2013.01); *H01L 51/524* (2013.01); *H01L 51/5268* (2013.01); *H01L 51/56* (2013.01); *H01L 51/0031* (2013.01); *H01L 51/5246* (2013.01); *H01L 51/5253* (2013.01); *H01L 51/5278* (2013.01);

(Continued)

(58) Field of Classification Search
CPC . H01L 2251/558; H01L 27/283; H01L 27/30; H01L 27/3211; H01L 51/0001; H01L 51/0035; H01L 51/0036; H01L 51/0097; H01L 51/0516; H01L 51/5237; H01L 51/5262
USPC .......................................................... 257/40
See application file for complete search history.

(56) References Cited

U.S. PATENT DOCUMENTS

| 8,253,155 B2 | 8/2012 | Krummacher et al. |
| 2003/0071567 A1 | 4/2003 | Eida et al. |

(Continued)

FOREIGN PATENT DOCUMENTS

| DE | 102004020245 A1 | 12/2005 |
| DE | 102007058453 A1 | 3/2009 |

(Continued)

OTHER PUBLICATIONS

English abstract of KR 1020100025210 A dated Mar. 9, 2010.

(Continued)

*Primary Examiner* — Stephen W Smoot
*Assistant Examiner* — Edward Chin

(57) ABSTRACT

A light-emitting component may include: an electrically active region, including a first electrode, a second electrode, an organic functional layer structure between the first electrode and the second electrode, a cover arranged above the electrically active region, and a layer structure arranged between the cover and the electrically active region. The component may have at least one layer having a refractive index which is less than the refractive index of the cover.

11 Claims, 8 Drawing Sheets

(52) U.S. Cl.
CPC ........ *H01L 51/5281* (2013.01); *H01L 51/5296* (2013.01); *H01L 2251/5323* (2013.01); *H01L 2251/5369* (2013.01); *H01L 2251/55* (2013.01)

(56) References Cited

U.S. PATENT DOCUMENTS

| | | |
|---|---|---|
| 2003/0116719 A1 | 6/2003 | Miyazawa |
| 2006/0102912 A1 | 5/2006 | Abe et al. |
| 2006/0180805 A1* | 8/2006 | Lutz et al. ............... 257/40 |
| 2007/0241668 A1 | 10/2007 | Ottermann et al. |
| 2007/0278951 A1 | 12/2007 | Koo et al. |
| 2010/0019664 A1 | 1/2010 | Mishima |
| 2011/0101855 A1* | 5/2011 | Mizuno ............... 313/504 |

FOREIGN PATENT DOCUMENTS

| | | | |
|---|---|---|---|
| EP | 1309017 A1 | 5/2003 | |
| EP | 1309017 A2 * | 5/2003 | ............ H01L 51/20 |
| KR | 1020030038431 A | 5/2003 | |
| KR | 1020100025210 A | 3/2010 | |
| WO | 02084338 A2 | 10/2002 | |

OTHER PUBLICATIONS

International Search Report issued in the corresponding PCT application No. PCT/EP2012/066203, dated Oct. 29, 2012.
Korean Office Action based on Application No. 10-2014-7012796 (4 pages of English translation) dated Mar. 6, 2015.

* cited by examiner

LIGHT-EMITTING COMPONENT AND METHOD FOR PRODUCING A LIGHT-EMITTING COMPONENT

RELATED APPLICATIONS

The present application is a national stage entry according to 35 U.S.C. §371 of PCT application No.: PCT/EP2012/066203 filed on Aug. 20, 2012, which claims priority from German application No.: 10 2011 084 437.6 filed on Oct. 13, 2011, and is incorporated herein by reference in its entirety.

TECHNICAL FIELD

Various embodiments relate to a light-emitting component and a method for producing a light-emitting component.

BACKGROUND

In a conventional transparent organic light-emitting diode (OLED) an adhesive having a refractive index of approximately 1.55 is usually used for the lamination of the cover glass. The achievable optical transparency of such a transparent organic light-emitting diode is limited.

SUMMARY

Various embodiments provide a light-emitting component in which a color adaptation of the light emitted by the component is achieved in a simple manner. Furthermore, various embodiments provide a light-emitting component in which the optical transparency of the component can be increased.

Various embodiments provide a light-emitting component, including: an electrically active region, including a first electrode, a second electrode, and an organic functional layer structure between the first electrode and the second electrode; a cover arranged above the electrically active region; and a layer structure arranged between the cover and the electrically active region and having at least one layer, wherein the at least one layer has a refractive index which is less than the refractive index of the cover.

Illustratively, the layer structure can be used in various embodiments, for example in an optically transparent light-emitting component, to put it another way in a top and bottom emitter, for example in a transparent organic light-emitting diode, wherein the layer structure in various embodiments may increase the transparency of the light-emitting component. This can be achieved in various embodiments without significantly increasing the total thickness of the light-emitting component.

In one configuration, the layer structure may include an adhesive or can be formed by an adhesive.

In another configuration, alternatively or additionally, the light-emitting component may include an adhesive between the cover (for example a glass cover, alternatively a film cover) and the at least one layer of the layer structure for fixing (for example laminating) the cover; wherein the at least one layer of the layer structure has a refractive index which is furthermore less than the refractive index of the adhesive. To put it another way, given the existence of an additional adhesive between the cover and the layer structure, the refractive index is for example both less than the refractive index of the cover and less than the refractive index of the adhesive. It should be pointed out that the cover can be, in principle, any arbitrary type of a cover, for example including any arbitrary type of one or more layers, for example including one or more lacquers or any other suitable layer.

In another configuration, the at least one layer of the layer structure can have a refractive index of less than 1.5. In various embodiments, the cover has for example a refractive index of greater than 1.5, for example of greater than 1.55, such that a distinct effect is already obtained in the case of a refractive index of the at least one layer of the layer structure of less than 1.5.

In another configuration, the at least one layer of the layer structure may include at least one fluoride or one fluorine-containing polymer.

In another configuration, the at least one layer of the layer structure may include a matrix having air inclusions or having particles which reduce the refractive index of the matrix.

In another configuration, the at least one layer of the layer structure may include aerogel or water encapsulated in the layer structure or in the light-emitting component.

In another configuration, the layer structure can have a layer thickness in a range of approximately 50 nm to approximately 150 nm, alternatively a layer thickness in a range of approximately 5 μm to approximately 50 μm. For these two layer thickness ranges, the best results were obtained with regard to increasing the transparency of the light-emitting component.

In another configuration, the light-emitting component may furthermore include a substrate and an encapsulation (for example a thin-film encapsulation), wherein the encapsulation is arranged on that side of the electrically active region which faces away from the substrate. The layer structure can be arranged above the encapsulation. By means of the encapsulation, the light-emitting component is protected even better against environmental influences such as moisture, for example.

In another configuration, the cover may include a first cover, which is arranged above a first main side of the electrically active region, and a second cover, which is arranged below a second main side of the electrically active region, said second main side being situated opposite the first main side. Illustratively, in various embodiments, on each main side of the light-emitting component, a respective cover, for example a glass cover, is provided for protecting the light-emitting component.

In another configuration, the light-emitting component can be designed as an organic light-emitting diode (OLED).

Various embodiments provide a method for producing a light-emitting component. The method may include forming an electrically active region, wherein forming the electrically active region may include forming a first electrode; forming a second electrode; and forming an organic functional layer structure between the first electrode and the second electrode. Furthermore, the method may include forming a layer structure having at least one layer above the electrically active region; and forming a cover above the layer structure; wherein the at least one layer of the layer structure has a refractive index which is less than the refractive index of the cover.

In one configuration, after forming the electrically active region and before forming the cover, the optical transparency of the structure having the electrically active region can be measured; and the layer structure can be formed depending on the measured optical transparency, such that a desired optical target transparency of the structure having the electrically active region and of the layer structure is obtained.

The configurations of the light-emitting component correspondingly apply, insofar as is practical, to the method for producing a light-emitting component.

It should be pointed out that, in the context of this description, the respective value of the refractive index relates to in each case one of the wavelengths of interest of the light being emitted, since the refractive index is generally not independent of the wavelength. Consequently, comparative values should be used in the case of specific wavelengths, as a result of which, however, the general statements to the effect that an index is greater or less than another retain their validity.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, a light-emitting component can be embodied as an organic light-emitting diode (OLED), or as an organic light-emitting transistor. In various embodiments, the light-emitting component can be part of an integrated circuit. Furthermore, a plurality of light-emitting components can be provided, for example in a manner accommodated in a common housing.

Figure 1:
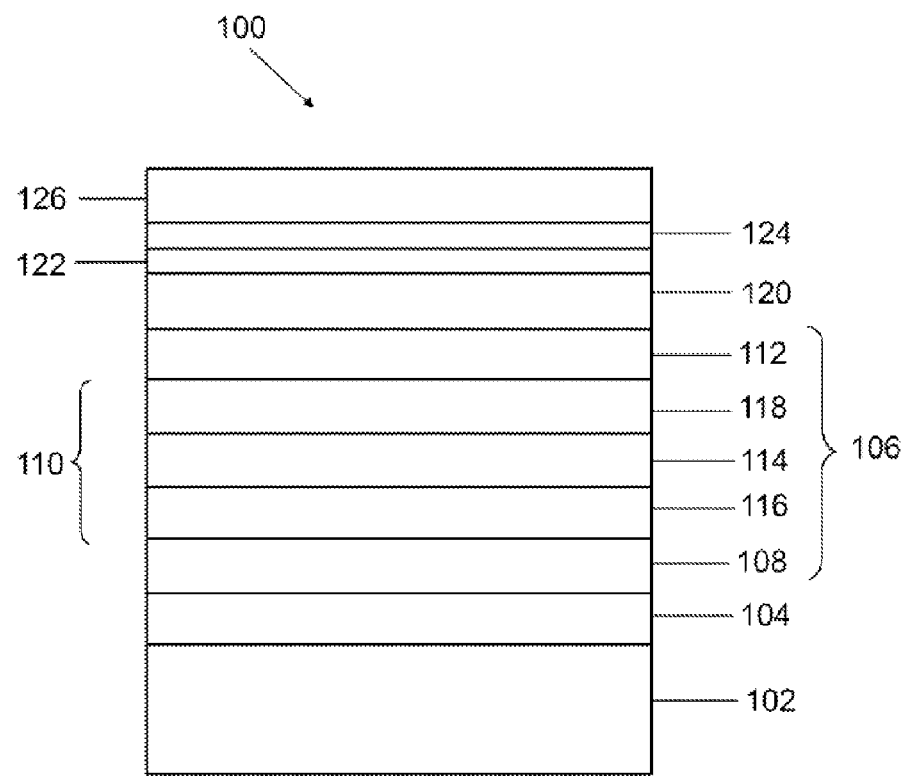
FIG. 1 shows a cross-sectional view of a light-emitting component in accordance with various embodiments.

FIG. 1 shows a cross-sectional view of a light-emitting component 100 in accordance with various embodiments.

The light-emitting component 100 in the form of an organic light-emitting diode 100 may have a substrate 102. The substrate 102 may serve for example as a carrier element for electronic elements or layers, for example light-emitting elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 102 may include one or more of the materials mentioned above. The substrate 102 can be embodied as translucent or even transparent.

In various embodiments, the term "translucent" or "translucent layer" can be understood to mean that a layer is transmissive to light, for example to the light generated by the light-emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light-emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light-emitting diode 100 (or else the light-emitting components in accordance with the embodiments that have been described above or will be described below) can be designed as a so-called top and bottom emitter. A top and bottom emitter may also be designated as an optically transparent component, for example a transparent organic light-emitting diode.

In various embodiments, a barrier layer 104 may optionally be arranged on or above the substrate 102. The barrier layer 104 may include or consist of one or more of the following materials: aluminum oxide, zinc oxide, zirconium oxide, titanium oxide, hafnium oxide, tantalum oxide lanthanium oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light-emitting component 100 can be arranged on or above the barrier layer 104. The electrically active region 106 can be understood as that region of the light-emitting component 100 in which an electric current for the operation of the light-emitting component 100 flows. In various embodiments, the electrically active region 106 can have a first electrode 108, a second electrode 112 and an organic functional layer structure 110, as will be explained in even greater detail below.

In this regard, in various embodiments, the first electrode 108 (for example in the form of a first electrode layer 108) may be applied on or above the barrier layer 104 (or, if the barrier layer 104 is not present, on or above the substrate 102). The first electrode 108 (also designated hereinafter as bottom electrode 108) may be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 108 may include a metal; for example Ag, Pt, Au, Mg, Al, Ba, In, Ag, Au, Mg, Ca, Sm or Li, and compounds, combinations or alloys of these materials.

In various embodiments, the first electrode 108 may be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 108 may provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 108 may include electrically conductive polymers or transition metal oxides or transparent electrically conductive oxides.

In various embodiments, the first electrode 108 and the substrate 102 may be formed as translucent or transparent. In the case where the first electrode 108 is formed from a metal, the first electrode 108 may have for example a layer thickness of less than or equal to approximately 25 nm, for example a layer thickness of less than or equal to approximately 20 nm, for example a layer thickness of less than or equal to approximately 18 nm. Furthermore, the first electrode 108 may have for example a layer thickness of greater than or equal to approximately 10 nm, for example a layer thickness of greater than or equal to approximately 15 nm. In various embodiments, the first electrode 108 may have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 108 is formed from a transparent conductive oxide (TCO), the first electrode 108 may have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 108 is formed from, for example, a network composed of metallic nanowires, for example composed of Ag, which may be combined with conductive polymers, a network composed of carbon nanotubes which can be combined with conductive polymers, or from graphene layers and composites, the first electrode 108 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 108 may be formed as an anode, that is to say as a hole-injecting electrode, or as a cathode, that is to say as an electron-injecting electrode.

The first electrode 108 can have a first electrical terminal, to which a first electrical potential (provided by an energy store (not illustrated), for example a current source or a voltage source) can be applied. Alternatively, the first electrical potential can be applied to the substrate 102 and then be fed indirectly to the first electrode 108 via said substrate. The first electrical potential can be, for example, the ground potential or some other predefined reference potential.

Furthermore, the electrically active region 106 of the light-emitting component 100 may have an organic electroluminescent layer structure 110, which is applied on or above the first electrode 108.

The organic electroluminescent layer structure 110 may contain one or a plurality of emitter layers 114, for example including fluorescent and/or phosphorescent emitters, and one or a plurality of hole-conducting layers 116 (also designated as hole transport layer(s) 116). In various embodiments, one or a plurality of electron-conducting layers 118 (also designated as electron transport layer(s) 118) can alternatively or additionally be provided.

Examples of emitter materials which can be used in the light-emitting component 100 in accordance with various embodiments for the emitter layer(s) 114 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 114 of the light-emitting component 100 can be selected for example such that the light-emitting component 100 emits white light. The emitter layer(s) 114 may include a plurality of emitter materials that emit in different colors (for example blue and yellow or blue, green and red); alternatively, the emitter layer(s) 114 can also be constructed from a plurality of partial layers, such as a blue fluorescent emitter layer 114 or blue phosphorescent emitter layer 114, a green phosphorescent emitter layer 114 and a red phosphorescent emitter layer 114. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic electroluminescent layer structure 110 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 110 may include one or a plurality of electroluminescent layers embodied as a hole transport layer 116, so as to enable for example in the case of an OLED an effective hole injection into an electroluminescent layer or an electroluminescent region. Alternatively, in various embodiments, the organic electroluminescent layer structure 110 may include one or a plurality of functional layers embodied as an electron transport layer 118, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer 116. In various embodiments, the one or the plurality of electroluminescent layers can be embodied as an electroluminescent layer.

In various embodiments, the hole transport layer 116 may be applied, for example deposited, on or above the first electrode 108, and the emitter layer 114 can be applied, for example deposited, on or above the hole transport layer 116. In various embodiments, the electron transport layer 118 can be applied, for example deposited, on or above the emitter layer 114.

In various embodiments, the organic electroluminescent layer structure 110 (that is to say for example the sum of the thicknesses of hole transport layer(s) 116 and emitter layer(s) 114 and electron transport layer(s) 118) may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of a plurality of organic light-emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of two, three or four OLEDs arranged directly one above another, in which case for example the organic electroluminescent layer structure 110 can have a layer thickness of a maximum of approximately 3 µm.

The light-emitting component 100 may optionally generally include further organic functional layers, for example arranged on or above the one or the plurality of emitter layers 114 or on or above the electron transport layer(s) 118, which serve to further improve the functionality and thus the efficiency of the light-emitting component 100.

The second electrode 112 (for example in the form of a second electrode layer 112) can be applied on or above the organic electroluminescent layer structure 110 or, if appropriate, on or above the one or the plurality of further organic functional layers.

In various embodiments, the second electrode 112 may include or be formed from the same materials as the first electrode 108, metals being particularly suitable in various embodiments.

In various embodiments, the second electrode 112 (for example for the case of a metallic second electrode 112) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 112 can generally be formed in a similar manner to the first electrode 108, or differently than the latter. In various embodiments, the second electrode 112 can be formed from one or more of the materials and with the respective layer thickness, as described above in connection with the first electrode 108. In various embodiments, both the first electrode 108 and the second electrode 112 are formed as translucent or transparent. Consequently, the light-emitting component 100 illustrated in FIG. 1 can be designed as a top and bottom emitter (to put it another way as a transparent light-emitting component 100).

The second electrode 112 may be formed as an anode, that is to say as a hole-injecting electrode, or as a cathode, that is to say as an electron-injecting electrode.

The second electrode 112 may have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 120, for example in the form of a barrier thin-film layer/thin-film encapsulation 120, can optionally also be formed on or above the second electrode 112 and thus on or above the electrically active region 106.

In the context of this application, a "barrier thin-film layer" or a "barrier thin film" 120 may be understood to mean, for example, a layer or a layer structure which is suitable for forming a barrier against chemical impurities or atmospheric substances, in particular against water (moisture) and oxygen. In other words, the barrier thin-film layer 120 is formed in such a way that OLED-damaging substances such as water, oxygen or solvent cannot penetrate through it or at most very small proportions of said substances can penetrate through it.

In accordance with one configuration, the barrier thin-film layer 120 can be formed as an individual layer (to put it another way, as a single layer). In accordance with an alternative configuration, the barrier thin-film layer 120 may include a plurality of partial layers formed one on top of another. In other words, in accordance with one configuration, the barrier thin-film layer 120 can be formed as a layer stack. The barrier thin-film layer 120 or one or a plurality of partial layers of the barrier thin-film layer 120 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PECVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 120 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 120 including a plurality of partial layers, one or a plurality of partial layers of the barrier thin-film layer 120 can be deposited by means of a different deposition method than an atomic layer deposition method, for example by means of a vapor deposition method.

In accordance with one configuration, the barrier thin-film layer 120 may have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 120 includes a plurality of partial layers, all the partial layers can have the same layer thickness. In accordance with another configuration, the individual partial layers of the barrier thin-film layer 120 can have different layer thicknesses. In other words, at least one of the partial layers can have a different layer thickness than one or more other partial layers.

In accordance with one configuration, the barrier thin-film layer 120 or the individual partial layers of the barrier thin-film layer 120 may be formed as a translucent or transparent layer. In other words, the barrier thin-film layer 120 (or the individual partial layers of the barrier thin-film layer 120) may consist of a translucent or transparent material (or a material combination that is translucent or transparent).

In accordance with one configuration, the barrier thin-film layer 120 or (in the case of a layer stack having a plurality of partial layers) one or a plurality of the partial layers of the barrier thin-film layer 120 may include or consist of one of the following materials: aluminum oxide, zinc oxide, zirconium oxide, titanium oxide, hafnium oxide, tantalum oxide lanthanium oxide, silicon oxide, silicon nitride, silicon oxynitride, indium tin oxide, indium zinc oxide, aluminum-doped zinc oxide, and mixtures and alloys thereof. In various embodiments, the barrier thin-film layer 120 or (in the case of a layer stack having a plurality of partial layers) one or a plurality of the partial layers of the barrier thin-film layer 120 may include one or a plurality of high refractive index materials, to put it another way one or a plurality of materials having a high refractive index, for example having a refractive index of at least 2.

In various embodiments, a low refractive index intermediate layer or low refractive index intermediate layer structure 122 (for example having one or a plurality of layers composed of the same material or different materials) may be arranged on or above the encapsulation 120 and serves, in the case of a transparent light-emitting component 100, to increase the total transparency thereof.

The intermediate layer 122 or intermediate layer structure 122 may include at least one layer which (at a predefined wavelength (for example at a predefined wavelength in a wavelength range of 380 nm to 780 nm)) has a refractive index which is less than the refractive index of a cover (at the predefined wavelength) of the light-emitting component 100, as will be explained in even greater detail below. In various embodiments, the intermediate layer or the at least one layer of the intermediate layer structure 122 or the entire intermediate layer structure 122 can have a refractive index which is less than the refractive index of a cover of the light-emitting component 100 as will be explained in even greater detail below. In various embodiments, the intermediate layer or the at least one layer of the intermediate layer structure 122 or the entire intermediate layer structure 122 can have a refractive index of less than 1.5, for example a refractive index of less than 1.49, for example a refractive index of less than 1.48, for example a refractive index of less than 1.47, for example a refractive index of less than 1.46, for example a refractive index of less than 1.45, for example a refractive index of less than 1.44, for example a refractive index of less than 1.43, for example a refractive index of less than 1.42, for example a refractive index of less than 1.41, for example a refractive index of less than 1.40, for example a refractive index of less than 1.39, for example a refractive index of less than 1.38, for example a refractive index of less than 1.37, for example a refractive index of less than 1.36, for example a refractive index of less than 1.35, for example a refractive index of less than 1.34, for example a refractive index of less than 1.33, for example a refractive index of less than 1.32, for example a refractive index of less than 1.31, for example a refractive index of less than 1.30, for example a refractive index of less than 1.25, for example a refractive index of less than 1.20, for example a refractive index of less than 1.15.

In various embodiments, the intermediate layer or the at least one layer of the intermediate layer structure 122 or the entire intermediate layer structure 122 may include at least one fluoride or one fluorine-containing polymer. A fluoride is particularly suitable since it usually has a relatively low refractive index. In this regard, by way of example, one or more of the following fluorides can be used in various embodiments:

- potassium fluoride (KF) (refractive index of approximately 1.36 at a light wavelength of 633 nm);
- lithium fluoride (LiF) (refractive index of approximately 1.39 at a light wavelength of 633 nm);
- magnesium fluoride ($MgF_2$) (refractive index of approximately 1.38 at a light wavelength of 633 nm);
- sodium fluoride (NaF) (refractive index of approximately 1.32 at a light wavelength of 633 nm);
- sodium aluminum fluoride ($Na_3AlF_6$) (refractive index of approximately 1.35 at a light wavelength of 633 nm);
- barium fluoride ($BaF_2$) (refractive index of approximately 1.47 at a light wavelength of 633 nm);
- calcium fluoride ($CaF_2$) (refractive index of approximately 1.43 at a light wavelength of 633 nm);
- lithium calcium aluminum fluoride ($LiCaAlF_6$) (refractive index of approximately 1.39 at a light wavelength of 633 nm);
- lithium yttrium fluoride ($LiYF_4$) (refractive index of approximately 1.45 at a light wavelength of 633 nm);
- strontium fluoride ($SrF_2$) (refractive index of approximately 1.44 at a light wavelength of 633 nm).

As fluorine-containing polymer, in various embodiments, by way of example, it is possible to provide the material class of the group of amorphous fluoropolymers for example based on the copolymers of 2,2-bistrifluoromethyl-4,5-difluoro-1, 3-dioxole (PDD). One example thereof is the material Teflon AF from Dupont (polytetrafluoroethylene, named as: fluorinated ethylenic cyclo oxyaliphatic substituted ethylenic copolymer). Teflon AF is commercially available and can be spin-coated, for example, in various solvents in the context of various embodiments. One advantage of this material class can be seen in the high (mechanical) durability.

In various embodiments, the intermediate layer or the at least one layer of the intermediate layer structure 122 or the entire intermediate layer structure 122 may include a matrix having air inclusions (for example having a pore size of less than approximately 40 nm (for example of approximately 1 nm to approximately 40 nm), for example having a pore size of less than approximately 30 nm (for example of approximately 1 nm to approximately 30 nm), for example having a pore size of less than approximately 20 nm (for example of approximately 1 nm to approximately 20 nm), for example having a pore size of less than approximately 10 nm (for example of approximately 1 nm to approximately 10 nm).

In various embodiments, the intermediate layer or the at least one layer of the intermediate layer structure 122 or the entire intermediate layer structure 122 may include a matrix having particles which reduce the refractive index of the matrix. By way of example, the particles may include or be formed from one or a plurality of the following materials: small air inclusions (also designated as pores); aerogel; and SiO. In various embodiments, the structure size of the air inclusions is in this case less than 50 nm.

In various embodiments, the intermediate layer or the at least one layer of the intermediate layer structure 122 or the entire intermediate layer structure 122 may include aerogel or water encapsulated in the layer structure or in the light-emitting component.

All the stated materials of the low refractive index intermediate layer or intermediate layer structure have a refractive index at the wavelengths of interest of the light emitted by the light-emitting component 100 which is less than the refractive index of the cover (and if appropriate, if present, of the adhesive (also designated as lamination adhesive)) at the respective wavelength(s) of the light emitted by the light-emitting component 100.

In various embodiments, the intermediate layer 122 or the at least one layer of the intermediate layer structure 122 or the entire intermediate layer structure 122 can have a layer thickness in a range of approximately 50 nm to approximately 150 nm, for example a layer thickness in a range of approximately 70 nm to approximately 130 nm, for example a layer thickness in a range of approximately 90 nm to approximately 110 nm. The effect of an increase in transparency is particularly high in these layer thickness ranges.

Alternatively, it was established that the effect of an increase in transparency is likewise particularly high in the case of a layer thickness in a range of approximately 5 μm to approximately 50 μm, for example in the case of a layer thickness in a range of approximately 10 μm to approximately 40 μm, for example in the case of a layer thickness in a range of approximately 20 μm to approximately 30 μm.

In various embodiments, the intermediate layer structure 122 may include a layer sequence having a plurality of low refractive index layers having different refractive indices.

On or above the intermediate layer 122 or the intermediate layer structure 122, it is possible to provide an adhesive and/or a protective lacquer 124, by means of which, for example, a cover 126 (for example a glass cover 126, is fixed, for example adhesively bonded, on the intermediate layer 122 or the intermediate layer structure 122. In various embodiments, the optically translucent layer composed of adhesive and/or protective lacquer 124 can have a layer thickness of greater than 1 μm, for example a layer thickness of several μm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2Oa$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 112 and the layer composed of adhesive and/or protective lacquer 124 an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, the adhesive can be designed in such a way that it itself has a refractive index which is less than the refractive index of the cover 126. In this case, the adhesive itself illustratively forms the intermediate layer 122 or the intermediate layer structure 122 or a part thereof. Such an adhesive can be, for example, a low refractive index adhesive such as, for example, an acrylate having a refractive index of approximately 1.3. Furthermore, a plurality of different adhesives which form an adhesive layer sequence can be provided.

Furthermore, it should be pointed out that, in various embodiments, an adhesive 124 may also be completely dispensed with, for example in embodiments in which the cover 126, for example composed of glass, is applied to the intermediate layer 122 or the intermediate layer structure 122 by means of plasma spraying, for example.

In embodiments in which both an intermediate layer 122 or an intermediate layer structure 122 and an adhesive 124 are provided, the at least one layer of the layer structure may have a refractive index which is also less than the refractive index of the adhesive 124.

In various embodiments, the cover 126 and/or the adhesive 124 may have a refractive index (for example at a wavelength of 633 nm) of 1.55.

Furthermore, in various embodiments, one or a plurality of antireflective layers (for example combined with the encapsulation 120, for example the thin-film encapsulation 120) may additionally be provided in the light-emitting component 100.

Figure 2:
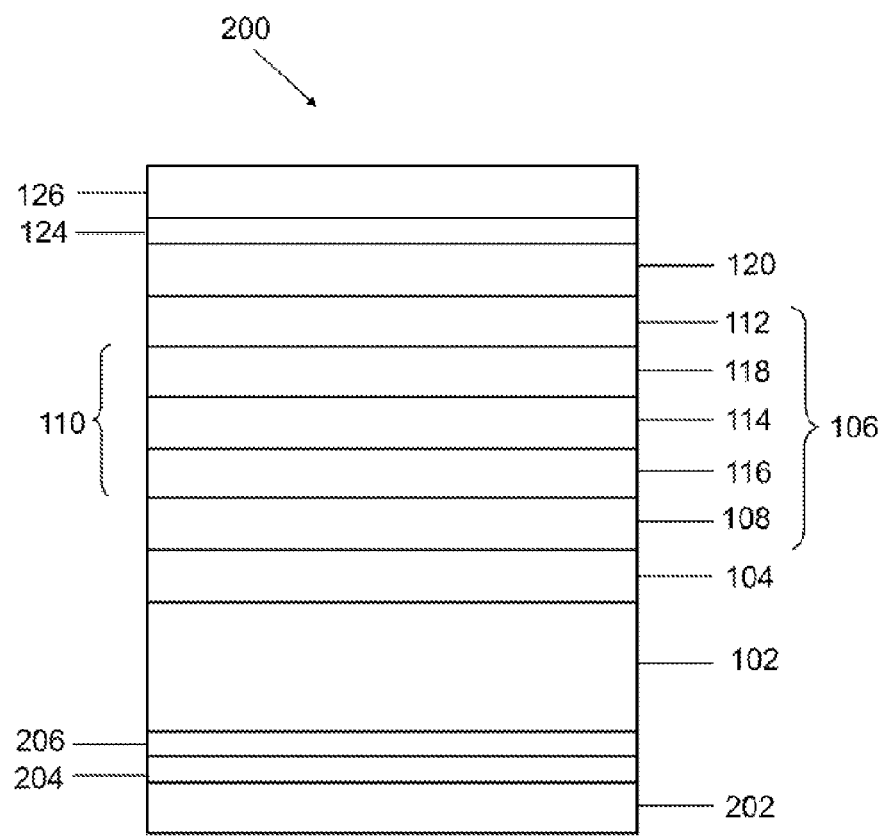
FIG. 2 shows a cross-sectional view of a light-emitting component in accordance with various embodiments.

FIG. 2 shows a cross-sectional view of a light-emitting component 200 in accordance with various embodiments, for example likewise implemented as an organic light-emitting diode 200.

The organic light-emitting diode 200 in accordance with FIG. 2 is identical in many aspects to the organic light-emitting diode 100 in accordance with FIG. 1, for which reason only the differences between the organic light-emitting diode 200 in accordance with FIG. 2 and the organic light-emitting diode 100 in accordance with FIG. 1 are explained in greater detail below; with regard to the remaining elements of the organic light-emitting diode 200 in accordance with FIG. 2, reference is made to the above explanations concerning the organic light-emitting diode 100 in accordance with FIG. 1.

In contrast to the organic light-emitting diode 100 in accordance with FIG. 1, in the case of the organic light-emitting diode 200 in accordance with FIG. 2, an additional cover 202, for example likewise composed of glass 204, is also provided below the substrate 102 and, analogously to the cover 126, can optionally be fixed by means of an adhesive 204, for example can be adhesively bonded.

In various embodiments, the light-emitting component 200 may be designed as a top and bottom emitter.

In various embodiments, a second intermediate layer 206 or intermediate layer structure 206 may be arranged between the exposed underside of the substrate 102 and the additional cover 202 and if appropriate, if present, the adhesive 204.

The second intermediate layer 206 or intermediate layer structure 206 may be constructed in the same way as the intermediate layer 122 or intermediate layer structure 122 such as was explained in connection with the light-emitting component 100 in FIG. 1. The adhesive 204, too, may be constructed in the same way as the adhesive 124 such as was explained in connection with the light-emitting component 100 in FIG. 1.

The intermediate layer 122 or intermediate layer structure 122 from FIG. 1 is omitted in the embodiments illustrated in FIG. 2.

Figure 3:
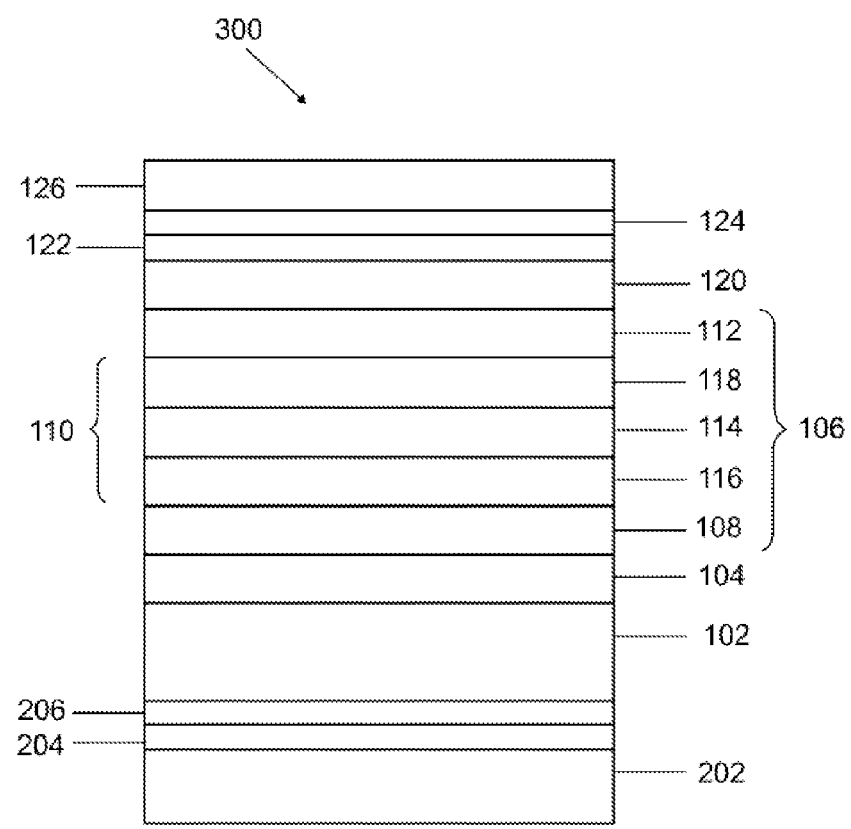
FIG. 3 shows a cross-sectional view of a light-emitting component in accordance with various embodiments.

FIG. 3 shows a cross-sectional view of a light-emitting component 300 in accordance with various embodiments, for example likewise implemented as an organic light-emitting diode 300.

Illustratively, the organic light-emitting diode 300 in accordance with FIG. 3 is a combination of the organic light-emitting diode 100 in accordance with FIG. 1 and the organic light-emitting diode 200 in accordance with FIG. 2.

In various embodiments, the organic light-emitting diode 300 in accordance with FIG. 3 is designed as a transparent organic light-emitting diode 300.

Illustratively, in various embodiments, at least one low refractive index intermediate layer or intermediate layer structure is arranged outside the electrically active region 106, but between the electrically active region 106 and the cover 126 and/or the second cover 202.

In various embodiments which can be combined arbitrarily with the embodiments described above, a low refractive index intermediate layer or intermediate layer structure can also be provided (not illustrated) between the substrate 102 and the first electrode 108 (if the barrier layer 104 is not present). For the case where the barrier layer 104 is provided, a low refractive index intermediate layer or intermediate layer structure can also be provided between the substrate 102 and the barrier layer 104 or between the barrier layer 104 and the first electrode 108 (not illustrated). Furthermore, an intermediate layer or intermediate layer structure can also be provided (not illustrated) within the encapsulation, i.e. for example within inorganic encapsulation layers (for example the topmost silicon oxide layer of the encapsulation).

Figure 4:
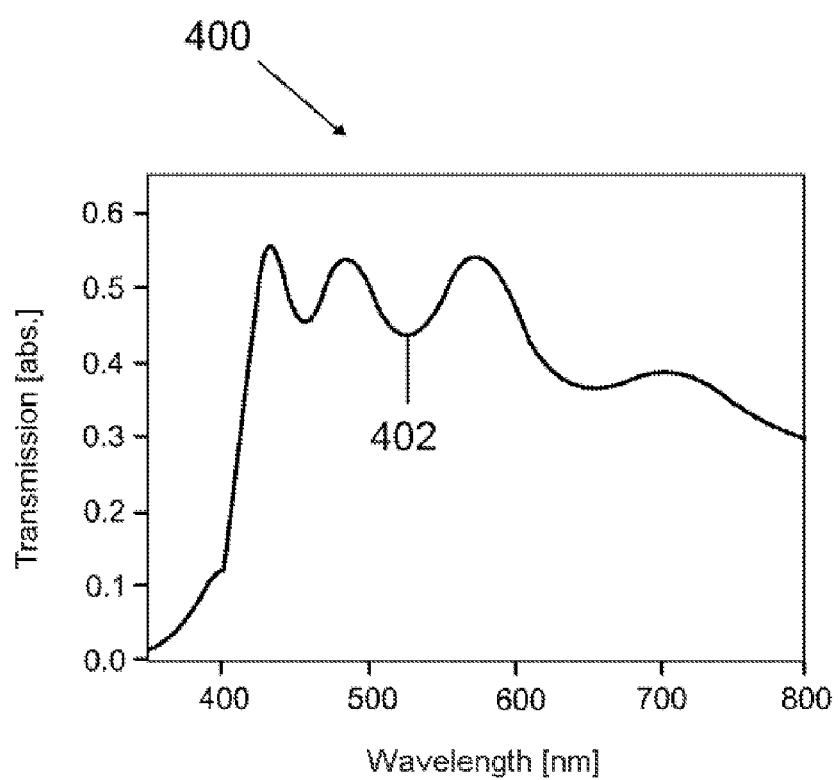
FIG. 4 shows a diagram illustrating the transmission of light by a light-emitting reference component, as a function of the wavelength of the emitted light.

FIG. 4 shows a diagram 400 illustrating the transmission of light by a light-emitting reference component, as a function of the wavelength of the emitted light. In terms of construction, the light-emitting reference component corresponds to the light-emitting component 100 as illustrated in FIG. 1, but without the intermediate layer 122 or intermediate layer structure 122. What is found on the basis of the simulation carried out is the characteristic curve 402 illustrated in FIG. 4 with an average transmission value (also designated as transparency value) T=46.5%.

Figure 5:
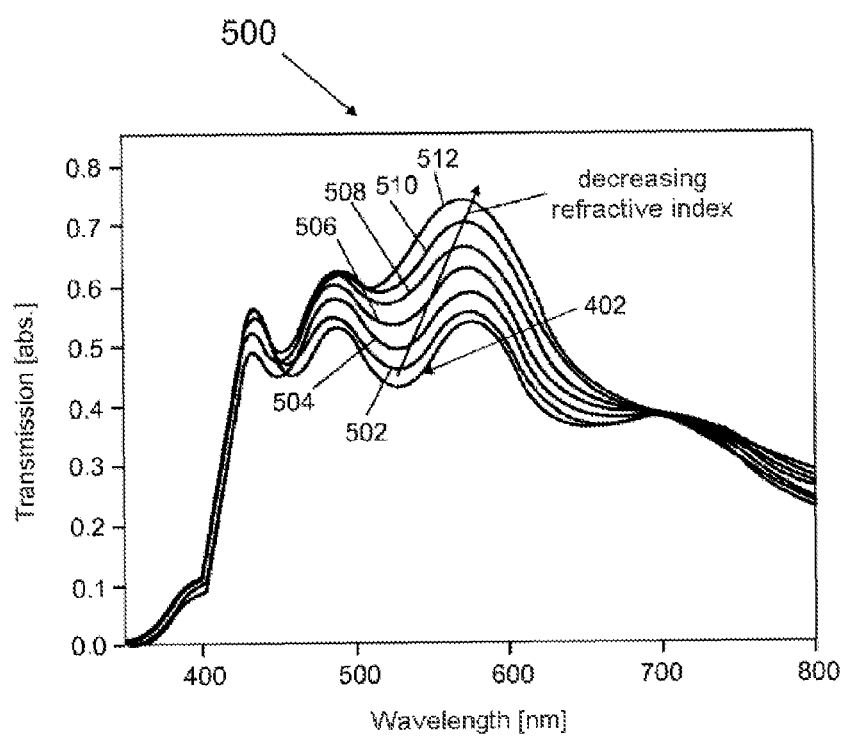
FIG. 5 shows a diagram illustrating the transmission of light by light-emitting components including an intermediate layer having in each case a different refractive index, as a function of the wavelength of the emitted light.

FIG. 5 shows a diagram 500 illustrating the transmission of light by light-emitting component including an intermediate layer having in each case a different refractive index, as a function of the wavelength of the emitted light.

In specific detail, the diagram 500 illustrates:
a first characteristic curve 502, which represents the transmission for a light-emitting component including an intermediate layer 122 having a refractive index of 1.5 and a layer thickness of 85 nm (this results in an average transmission value T=48.44% for a wavelength range of 450 nm to 650 nm);
a second characteristic curve 504, which represents the transmission for a light-emitting component including an intermediate layer 122 having a refractive index of 1.4 (for example composed of $MgF_2$) and a layer thickness of 90 nm (this results in an average transmission value T=51.44% for a wavelength range of 450 nm to 650 nm);
a third characteristic curve 506, which represents the transmission for a light-emitting component including an intermediate layer 122 having a refractive index of 1.3 (for example composed of Teflon AF from Dupont) and a layer thickness of 100 nm (this results in an average transmission value T=54.44% for a wavelength range of 450 nm to 650 nm);
a fourth characteristic curve 508, which represents the transmission for a light-emitting component including an intermediate layer 122 having a refractive index of 1.2 and a layer thickness of 110 nm (this results in an average transmission value T=57.27% for a wavelength range of 450 nm to 650 nm);
a fifth characteristic curve 510, which represents the transmission for a light-emitting component including an intermediate layer 122 having a refractive index of 1.1 and a layer thickness of 125 nm (this results in an average transmission value T=59.75% for a wavelength range of 450 nm to 650 nm); and a sixth characteristic curve 512, which represents the transmission for a light-emitting component including an intermediate layer 122 having a refractive index of 1.0 and a layer thickness of 140 nm (this results in an average transmission value T=61.6% for a wavelength range of 450 nm to 650 nm).

It is evident that the transmission and thus the transparency of the light-emitting component 100 is increased, the lower the refractive index of the intermediate layer 122 or intermediate layer structure 122.

The following table shows for some selected materials for the intermediate layer 122 once again the refractive index of the material at a light wavelength of 633 nm and an "optimum layer thickness" of the intermediate layer 122. In this case, the expression "optimum layer thickness" relates to the optimum layer thickness relative to the reference component for the purpose of obtaining the highest possible transparency in the wavelength range of 450 nm to 650 nm.

| Material | Refractive index at 633 nm | Optimum layer thickness [nm] |
|---|---|---|
| $BaF_2$ | 1.473 | 88.25 |
| $CaF_2$ | 1.43289 | 91.51 |
| KF | 1.3616 | 97.29 |
| $LiCaAlF_6$ | 1.39151 | 94.83 |
| LiF | 1.39127 | 94.84 |
| $LiY_4$ | 1.4469 | 90.32 |
| $MgF_2$ | 1.37698 | 96.02 |
| NaF | 1.32454 | 100.43 |
| $SrF_2$ | 1.4369 | 91.20 |
| Teflon AF | Approximately 1.3 | Approximately 100 |

Figure 6:
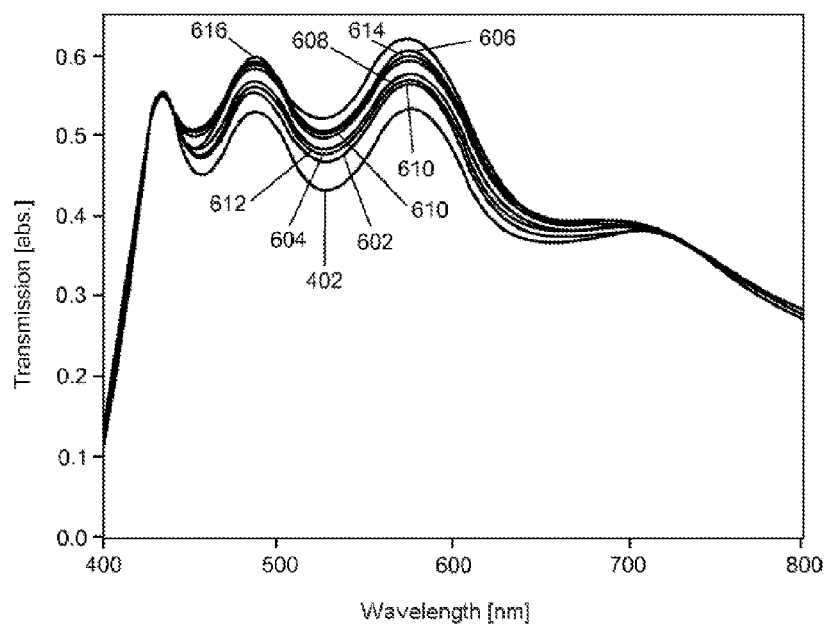
FIG. 6 shows a diagram illustrating the transmission of light by light-emitting components including an intermediate layer having in each case a different refractive index, as a function of the wavelength of the emitted light.

FIG. 6 shows a diagram 600 illustrating the transmission of light by light-emitting component including an intermediate layer having the materials presented in the table above, as a function of the wavelength of the emitted light.

In specific detail, the diagram 600 illustrates:

a first characteristic curve 602, which represents the transmission for a light-emitting component including an intermediate layer 122 composed of $BaF_2$ having a layer thickness of 88.25 nm (this results in an average transmission value T=49.2% for a wavelength range of 450 nm to 650 nm);

a second characteristic curve 604, which represents the transmission for a light-emitting component including an intermediate layer 122 composed of $CaF_2$ having a layer thickness of 91.51 nm (this results in an average transmission value T=50.4% for a wavelength range of 450 nm to 650 nm);

a third characteristic curve 606, which represents the transmission for a light-emitting component including an intermediate layer 122 composed of KF having a layer thickness of 97.29 nm (this results in an average transmission value T=52.6% for a wavelength range of 450 nm to 650 nm);

a fourth characteristic curve 608, which represents the transmission for a light-emitting component including an intermediate layer 122 composed of $LiCaAlF_6$ having a layer thickness of 94.83 nm (this results in an average transmission value T=51.7% for a wavelength range of 450 nm to 650 nm);

a fifth characteristic curve 610, which represents the transmission for a light-emitting component including an intermediate layer 122 composed of LiF having a layer thickness of 94.84 nm (this results in an average transmission value T=51.7% for a wavelength range of 450 nm to 650 nm);

a sixth characteristic curve 612, which represents the transmission for a light-emitting component including an intermediate layer 122 composed of $LiYF_4$ having a layer thickness of 90.32 nm (this results in an average transmission value T=50.0% for a wavelength range of 450 nm to 650 nm);

a seventh characteristic curve 614, which represents the transmission for a light-emitting component including an intermediate layer 122 composed of $MgF_2$ having a layer thickness of 96.02 nm (this results in an average transmission value T=52.1% for a wavelength range of 450 nm to 650 nm);

an eighth characteristic curve 616, which represents the transmission for a light-emitting component including an intermediate layer 122 composed of NaF having a layer thickness of 100.43 nm (this results in an average transmission value T=53.7% for a wavelength range of 450 nm to 650 nm); and a ninth characteristic curve 618, which represents the transmission for a light-emitting component including an intermediate layer 122 composed of $SrF_2$ having a layer thickness of 91.20 nm (this results in an average transmission value T=50.3% for a wavelength range of 450 nm to 650 nm).

Figure 7:
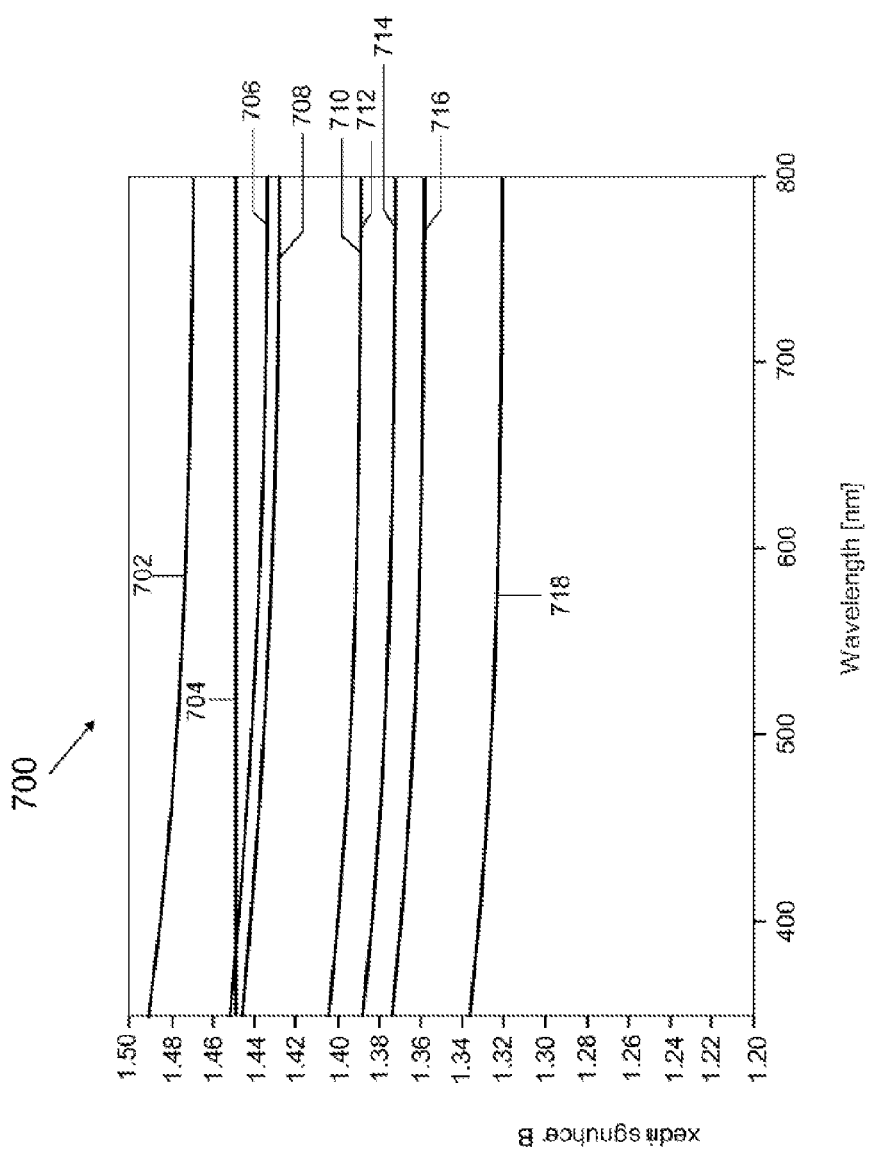
FIG. 7 shows a diagram illustrating the refractive index as a function of the light wavelength for various materials.

FIG. 7 shows a diagram 700 illustrating the refractive index as a function of the light wavelength (in a wavelength range of 350 nm to 800 nm) for the materials presented in the table above.

In specific detail, the diagram 700 illustrates:

a first refractive index characteristic curve 702 for $BaF_2$;

a second refractive index characteristic curve 704 for $LiYF_4$;

a third refractive index characteristic curve 706 for $SrF_2$;

a fourth refractive index characteristic curve 708 for $CaF_2$;

a fifth refractive index characteristic curve 710 for $LiCaAlF_6$;

a sixth refractive index characteristic curve 712 for LiF;

a seventh refractive index characteristic curve 714 for $MgF_2$;

an eighth refractive index characteristic curve 716 for KF; and a ninth refractive index characteristic curve 718 for NaF.

Figure 8:
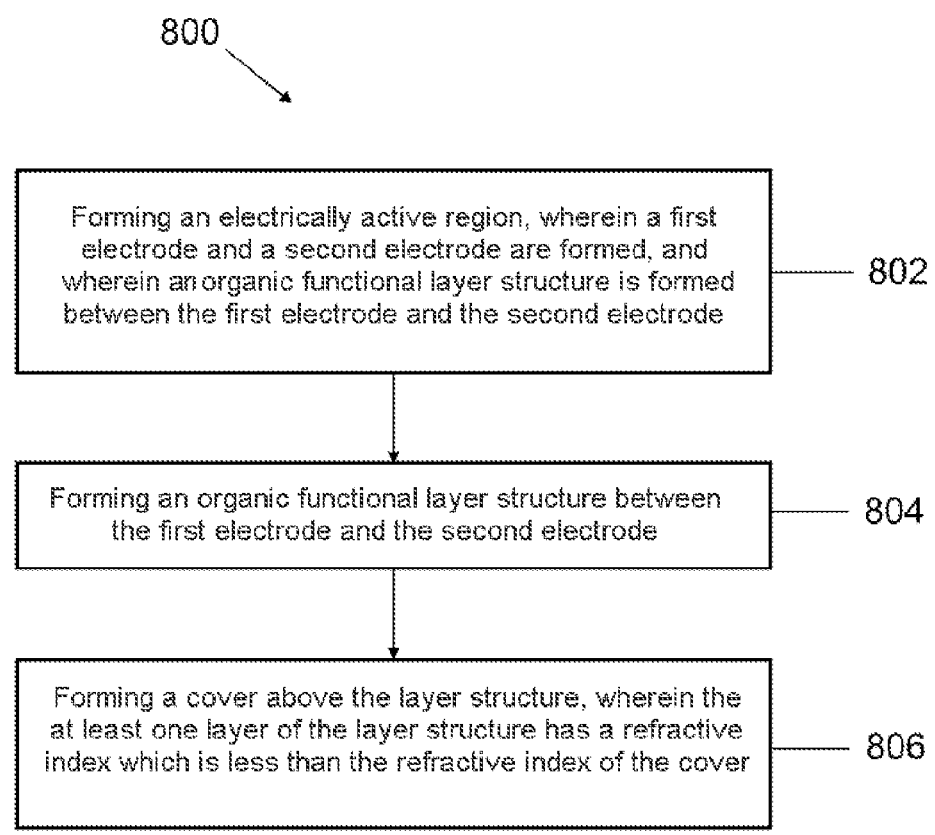
FIG. 8 shows a flow chart illustrating a method for producing a light-emitting component in accordance with various embodiments.

FIG. 8 shows a flow chart 800 illustrating a method for producing a light-emitting component in accordance with various embodiments.

In 802 an electrically active region is formed, wherein a first electrode and a second electrode are formed, and wherein an organic functional layer structure is formed between the first electrode and the second electrode. Furthermore, in 804 a layer structure having at least one layer can be formed above the electrically active region followed by forming a cover above the layer structure in 806, wherein the at least one layer of the layer structure has a refractive index which is less than the refractive index of the cover.

The various layers, for example the intermediate layer 122 or intermediate layer structure 122, the electrodes 108, 112 and the other layers of the electrically active region 106 such as, for example, the organic functional layer structure 114, the hole transport layer(s) 116 or the electron transport layer(s) 118 can be applied, for example deposited, by means of various processes, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

In various embodiments, a plasma enhanced chemical vapor deposition (PE-CVD) method can be used as CVD method. In this case, a plasma can be generated in a volume above and/or around the element to which the layer to be applied is intended to be applied, wherein at least two gaseous starting compounds are fed to the volume, said compounds being ionized in the plasma and excited to react with one another. The generation of the plasma can make it possible that the temperature to which the surface of the element is to be heated in order to make it possible to produce the dielectric layer, for example, can be reduced in comparison with a plasmaless CVD method. That may be advantageous, for example, if the element, for example the light-emitting electronic component to be formed, would be damaged at a temperature above a maximum temperature. The maximum temperature can be approximately 120° C. for example in the case of a light-emitting electronic component to be formed in accordance with various embodiments, such that the temperature at which the dielectric layer for example is applied can be less than or equal to 120° C. and for example less than or equal to 80° C.

Furthermore, it can be provided that after forming the electrically active region and before forming the cover, the optical transparency of the structure having the electrically active region is measured. The intermediate layer or intermediate layer structure can then be formed depending on the measured optical transparency, such that a desired optical target transparency of the structure having the electrically active region and of the intermediate layer or intermediate layer structure is obtained (in this regard, by way of example, the layer thickness and/or a choice of material of the intermediate layer or intermediate layer structure can be adapted).

In various embodiments it was recognized that the transparency of a light-emitting component such as an OLED, for example, can be increased by the use of a very thin layer having a low refractive index in comparison with the adhesive and cover glass (both of which usually have approximately the same refractive index). In various embodiments, the layer thickness is in a range of 50 nm to 150 nm. As explained above, the transparency of the light-emitting component can be significantly increased depending on the refractive index and the thickness of the layer.

In various embodiments, such a low refractive index layer (i.e. for example having a refractive index of less than 1.5) can be introduced in the ongoing process flow as an additional layer on the encapsulation, for example the thin-film encapsulation.

As explained above, a low refractive index intermediate layer or low refractive index intermediate layer structure increases the transparency of the light-emitting component, without significantly altering the total thickness of the light-emitting component.

It is likewise possible to use the low refractive index intermediate layer or low refractive index intermediate layer structure to compensate for changes in the transparency on account of process fluctuations of thin metal films within the light-emitting component, for example an OLED. For this purpose, after the thin-film encapsulation of the light-emitting component, the transparency can be measured and, if there is a negative deviation with respect to the target value, then said deviation can be compensated for by means of such a thin low refractive index intermediate layer or low refractive index intermediate layer structure.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component, comprising:
   an electrically active region, comprising:
      a first electrode;
      a second electrode;
      an organic functional layer structure between the first electrode and the second electrode;
   a cover arranged above the electrically active region; and
   a layer structure arranged between the cover and the electrically active region and having at least one layer, wherein the at least one layer has a refractive index which is less than a refractive index of the cover; and
   an adhesive between the cover and the at least one layer of the layer structure for fixing the cover,
   wherein the refractive index of the at least one layer of the layer structure is less than a refractive index of the adhesive,
   wherein the adhesive is a different material from the at least one layer of the layer structure.

2. The light-emitting component as claimed in claim 1, wherein the at least one layer of the layer structure has a refractive index of less than 1.5.

3. The light-emitting component as claimed in claim 1, wherein the at least one layer of the layer structure comprises at least one fluoride or one fluorine-containing polymer.

4. The light-emitting component as claimed in claim 1, wherein the at least one layer of the layer structure comprises a matrix having air inclusions or having particles which reduce the refractive index of the matrix.

5. The light-emitting component as claimed in claim 1, wherein the at least one layer of the layer structure comprises aerogel or water encapsulated in the layer structure or in the light-emitting component.

6. The light-emitting component as claimed in claim 1, wherein the layer structure has a layer thickness in a range of approximately 50 nm to approximately 150 nm; or wherein the layer structure has a layer thickness in a range of approximately 5 μm to approximately 50 μm.

7. The light-emitting component as claimed in claim 1, further comprising a substrate and an encapsulation,
   wherein the encapsulation is arranged on that side of the electrically active region which faces away from the substrate;
   wherein the layer structure is arranged above the encapsulation.

8. The light-emitting component as claimed in claim 1, wherein the cover comprises a first cover, which is arranged above a first main side of the electrically active region, and a second cover, which is arranged below a second main side of the electrically active region, said second main side being situated opposite the first main side.

9. The light-emitting component as claimed in claim 1, designed as an organic light-emitting diode.

10. A method for producing a light-emitting component, comprising:

forming an electrically active region, wherein forming the electrically active region comprises:
   forming a first electrode;
   forming a second electrode;
   forming an organic functional layer structure between the first electrode and the second electrode;
   forming a layer structure comprising at least one layer above the electrically active region and further comprising an adhesive; and
   forming a cover above the layer structure;
wherein the at least one layer of the layer structure has a refractive index which is less than a refractive index of the cover and is less than a refractive index of the adhesive, and
wherein the adhesive is between the cover and the at least one layer of the layer structure for fixing the cover.

11. The method as claimed in claim 10,
wherein, after forming the electrically active region and before forming the cover, the optical transparency of the structure having the electrically active region is measured; and
wherein the layer structure is formed depending on the measured optical transparency, such that a desired optical target transparency of the structure having the electrically active region and of the layer structure is obtained.

* * * * *

UNITED STATES PATENT AND TRADEMARK OFFICE
CERTIFICATE OF CORRECTION

PATENT NO. : 9,130,196 B2  
APPLICATION NO. : 14/348906  
DATED : September 8, 2015  
INVENTOR(S) : Erwin Lang et al.

Page 1 of 1

It is certified that error appears in the above-identified patent and that said Letters Patent is hereby corrected as shown below:

In the specification  
Column 9, line 37: Please delete "(PECVD)" between the words "deposition" and "method", and write "(PLCVD)" in place thereof.

Signed and Sealed this  
Nineteenth Day of July, 2016

Michelle K. Lee  
*Director of the United States Patent and Trademark Office*